United States Patent
Mazurek et al.

(10) Patent No.: US 8,637,226 B2
(45) Date of Patent: *Jan. 28, 2014

(54) METHOD OF FORMING AN IMAGE HAVING MULTIPLE PHASES

(75) Inventors: Mieczyslaw H. Mazurek, Roseville, MN (US); Raymond P. Johnston, Lake Elmo, MN (US); John E. Potts, Woodbury, MN (US); Marc D. Radcliffe, Newport, MN (US); Kevin R. Schaffer, Woodbury, MN (US); Audrey A. Sherman, St. Paul, MN (US); Wendi J. Winkler, Minneapolis, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/368,401

(22) Filed: Feb. 8, 2012

(65) Prior Publication Data

US 2012/0135207 A1     May 31, 2012

Related U.S. Application Data

(62) Division of application No. 11/930,800, filed on Oct. 31, 2007, now Pat. No. 8,133,644.

(51) Int. Cl.
| | |
|---|---|
| *G03F 7/00* | (2006.01) |
| *G03F 7/027* | (2006.01) |
| *G03F 7/028* | (2006.01) |
| *G03F 7/025* | (2006.01) |
| *G03F 7/22* | (2006.01) |

(52) U.S. Cl.
USPC ............... 430/322; 430/18; 430/20; 430/54; 430/281.1; 430/286.1; 430/288.1; 430/290; 430/296; 430/321; 430/325; 430/328; 430/394; 430/942; 430/945

(58) Field of Classification Search
None
See application file for complete search history.

(56) References Cited

U.S. PATENT DOCUMENTS

| | | | |
|---|---|---|---|
| 5,514,730 A * | 5/1996 | Mazurek et al. ............... | 522/99 |
| 6,051,625 A | 4/2000 | Harkness et al. | |
| 6,121,378 A * | 9/2000 | Miyawaki et al. ............ | 525/100 |
| 6,256,146 B1 | 7/2001 | Merrill et al. | |
| 6,297,906 B1 | 10/2001 | Allen et al. | |
| 6,590,705 B1 | 7/2003 | Allen et al. | |
| 6,590,707 B1 | 7/2003 | Weber | |
| 6,727,313 B2 | 4/2004 | Zhou et al. | |
| 6,986,855 B1 | 1/2006 | Hood et al. | |
| 7,087,691 B2 | 8/2006 | Rhodes et al. | |
| 7,101,654 B2 | 9/2006 | Wu et al. | |
| 7,586,685 B2 | 9/2009 | Dunn et al. | |
| 7,862,898 B2 | 1/2011 | Sherman et al. | |
| 7,892,649 B2 | 2/2011 | Sherman et al. | |
| 7,951,319 B2 | 5/2011 | Sherman | |
| 7,998,587 B2 | 8/2011 | Mazurek et al. | |
| 2003/0129385 A1* | 7/2003 | Hojo et al. ..................... | 428/323 |
| 2008/0027199 A1 | 1/2008 | Mazurek et al. | |
| 2011/0198781 A1 | 8/2011 | Sherman et al. | |

OTHER PUBLICATIONS

Mazurek, et al., Journal of Applied Polymer Science, "Novel Materials Based on Silicone-Acrylate Copolymer Networks", vol. 80, pp. 159-180, (2001).

Mazurek, et al., "Shape Memory Polymer Articles With a Microstructured Surface", U.S. Appl. No. 13/296362, filed Nov. 15, 2011.

Leewis, "Formation of Mesoscopic Polymer Structures for Optical Devices: A Nuclear Microprobe Study", Eindhoven: Technische Universiteit Eindhoven, 2002.

\* cited by examiner

*Primary Examiner* — Sin Lee
(74) *Attorney, Agent, or Firm* — Jeffrey M. Olofson

(57) ABSTRACT

A method of forming an image having multiple phases is disclosed herein. The method includes forming exposed and unexposed areas, the exposed areas comprising a first polymer network exhibiting first and second phases that are chemically connected and have different refractive indices, the first phase being continuous, and the second phase comprising a plurality of structures dispersed within the first phase, and the unexposed areas comprising a second polymer network comprising third and fourth phases that are chemically connected and have different refractive indices, the third phase being continuous, and the fourth phase comprising a plurality of structures dispersed within the third phase. The first and second polymer networks are chemically connected, and morphology formed by the first and second phases is different than that formed by the third and fourth phases.

15 Claims, 4 Drawing Sheets

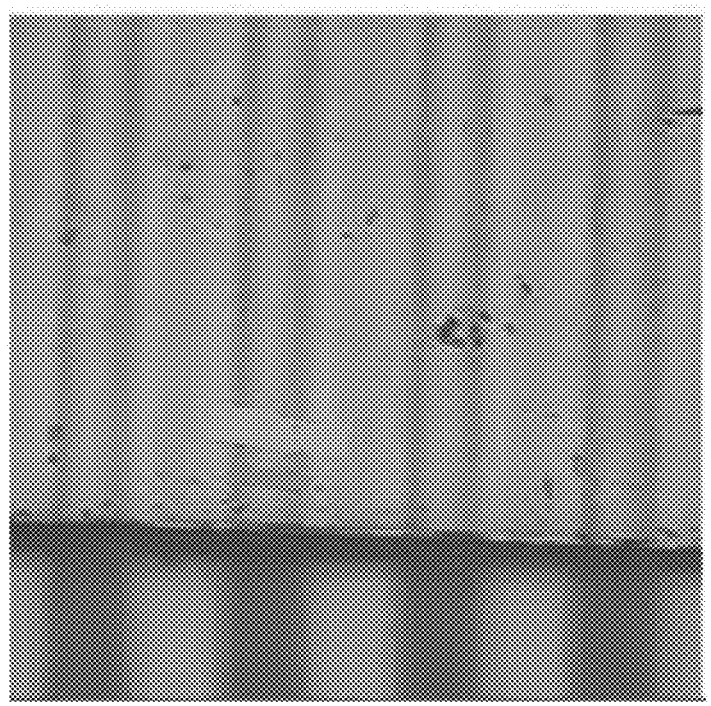
Fig. 2b  200μm
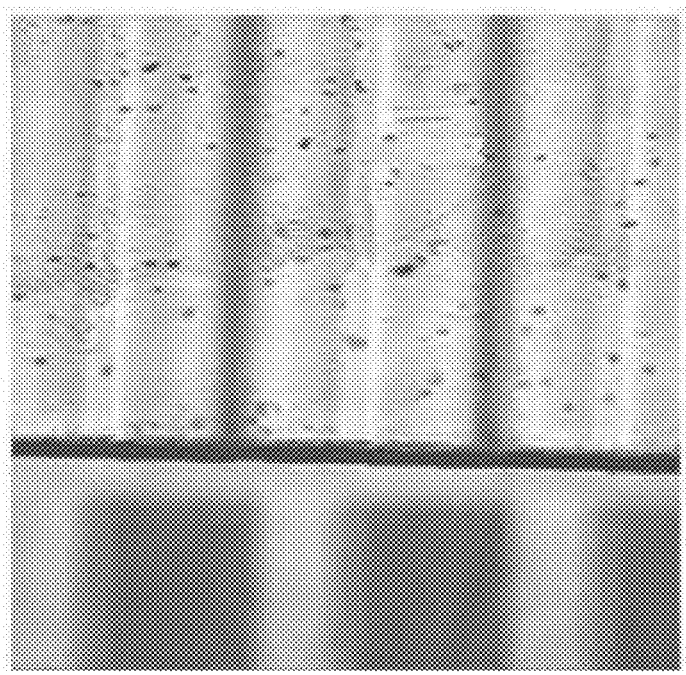
Fig. 2c  200μm

METHOD OF FORMING AN IMAGE HAVING MULTIPLE PHASES

CROSS-REFERENCE TO RELATED APPLICATIONS

This application is a divisional of U.S. patent application Ser. No. 11/930,800, filed Oct. 31, 2007, now U.S. Pat. No. 8,133,644, the disclosure of which is incorporated by reference in its entirety herein.

This application is related to commonly assigned U.S. patent application Ser. No. 11/930,549, now U.S. Pat. No. 7,998,587, filed Oct. 31, 2007, and commonly assigned U.S. patent application Ser. No. 13/176744, which is a divisional of U.S. Pat. No. 7,998,587.

BACKGROUND

This disclosure relates to a method of forming an image, and particularly, to a method of forming copolymer networks of multiple phases in an imagewise manner.

Certain classes of silicone acrylate copolymers can form polymer networks containing more than one phase. For example, a class of silicone acrylate copolymers can be formed by in-situ copolymerization of telechelic free radically polymerizable polydimethylsiloxanes with various (meth)acrylate monomers; articles such as films made with these copolymers can exhibit different morphologies resulting from the microscale phase separation typical of most compositions of matter made up of two or more polymers. The morphology of the phases can be tailored with the appropriate choice of components and their relative amounts, as well as by variation of reaction conditions that affect polymerization kinetics and phase separation. Films ranging from strong elastomers to plastics can be made depending on the composition and morphology.

BRIEF SUMMARY

In one aspect, a method of forming an image is disclosed herein. The method comprises: providing a substrate; applying an imageable composition to the substrate to form a layer of the imageable composition on the substrate, the imageable composition comprising a solution of free radically polymerizable monomers; imagewise exposing the layer to radiation to form exposed and unexposed areas, the exposed areas comprising a first polymer network exhibiting a first phase and a second phase that are chemically connected and have different refractive indices, the first phase being continuous, and the second phase comprising a plurality of structures dispersed within the first phase; and exposing the unexposed areas to radiation to form a second polymer network comprising a third phase and a fourth phase that are chemically connected and have different refractive indices, the third phase being continuous, and the fourth phase comprising a plurality of structures dispersed within the third phase; wherein the first and second polymer networks are chemically connected, and morphology formed by the first and second phases is different than that formed by the third and fourth phases.

In another aspect, the method may comprise: providing a film of a silicone (meth)acrylate copolymer network exhibiting a first phase and a second phase, the first phase and the second phase being chemically connected and having different refractive indices, the first phase being continuous, and the second phase comprising a plurality of structures dispersed within the first phase; orienting the film to form an oriented film; and heating the oriented film in an imagewise manner thereby forming an image.

In another aspect, an image is disclosed herein, the image comprising: a first polymer network exhibiting a first phase and a second phase that are chemically connected and have different refractive indices, the first phase being continuous, and the second phase comprising a plurality of structures dispersed within the first phase; and a second polymer network comprising a third phase and a fourth phase that are chemically connected and have different refractive indices, the third phase being continuous, and the fourth phase comprising a plurality of structures dispersed within the third phase; wherein the first and second polymer networks are chemically connected, and morphology formed by the first and second phases is different than that formed by the third and fourth phases. The polymer networks may be oriented, i.e., the first and second polymer networks may be uniaxially or biaxially oriented. The image may comprise microcavities.

These and other aspects of the invention are described in the detailed description below. In no event should the above summary be construed as a limitation on the claimed subject matter which is defined solely by the claims as set forth herein.

BRIEF DESCRIPTION OF THE DRAWINGS

The invention may be more completely understood in consideration of the following detailed description in connection with the following figures:

FIGS. 2a-2c show images of masks with linear patterns matched to the patterns formed in the corresponding images.

FIG. 6b shows a micrograph of the film used in FIG. 6a.

DETAILED DESCRIPTION

Figure 1:
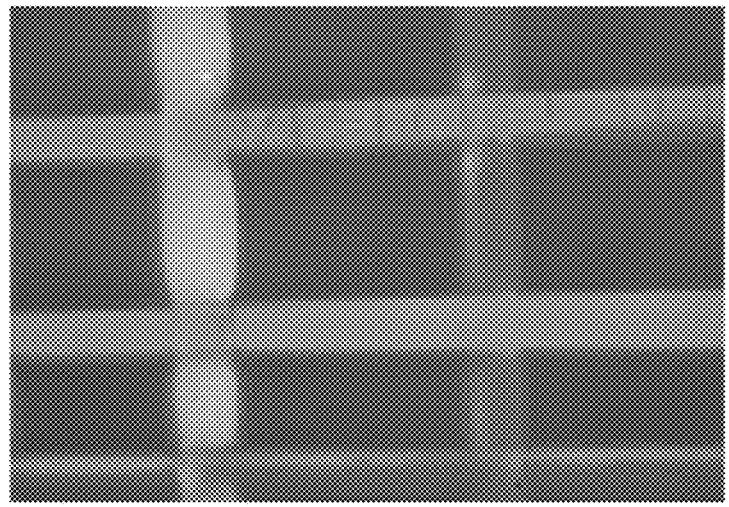
FIG. 1 shows a micrograph of an image formed according to the method disclosed herein.

The present disclosure provides imaging methods having numerous advantages. Free radically polymerizable components are polymerized to form a film comprising a silicone acrylate polymer network. At the discretion of the user, the film can be patterned or imaged either after or during the curing process to generate a visibly imaged film. In one embodiment, the film can be heat patterned to permanently set or imaged after it has been formed. In another embodiment, the free radically polymerizable components are polymerized in an imagewise manner by exposure through a mask. In this latter case, the image is formed during the exposure which, at the same time, imparts a surface topology to the film due to the preferential regional shrinkage of the curing medium. Thus, this latter patterning approach may reveal a wealth of opportunities associated with the controlled modification of properties, especially optical properties, of the silicone acrylate copolymer films. It is believed that similar phenomena would be observed in other two-phase copolymer networks made by free radical polymerization; the state-of the-art in this field has not been recognized to this point, although "photo-printing" (or photoimaging) of curable systems is known.

The imaging method (as used herein, the term method is used to refer to one or more methods) disclosed herein is also advantageous in that it may be used for creating durable microreplication metal tools. As described above, selective (patterned) cure can create surface topology of the copolymeric films, and in some cases, regional shrinkage associated with curing through the mask is so strong that surface topology is easily visible (and easy to feel) on the surface of the cover film which is typically polyethylene terephthalate (PET). Thus, the method may be feasible for creating microstructured surfaces. Structured PET surfaces can be further replicated, for example, by electroforming.

Another advantage of the imaging method disclosed herein is that the imageable composition can be polymerized when coated on a microstructured surface such as a retro-reflective surface. This allows for regional masking, so that images resembling watermarks can be made. Imaging can be carried out without having to have separate tools required for making the watermarks. If desired, however, a tool can be made from a film generated with a watermark.

Another advantage of the imaging method disclosed herein is their ability to carry additional materials soluble in one of the components, which preferentially ends up being trapped in one of the phases (or, at the interfaces) upon polymerization. Examples of additional materials include liquid crystals, nanoparticles, and mixtures thereof. When liquid crystals are used, for example, the resulting film can be oriented such that the oriented film shows distinct diffractive patterns and/or directional diffusion. Thus, such films can be used in optical applications.

Yet another advantage of the imaging method disclosed herein is that the method utilizes known materials and equipment. The free radically polymerizable components can be readily synthesized using known methods and readily available starting materials from commercial suppliers. Thus, the user has access to ample supply of material. Further, synthetic procedures allow for a variety of combinations of components or monomers that can be polymerized in a range of relative amounts. This allows the user to obtain a wide variety of films having different morphological profiles. The method disclosed herein is also advantageous in that imaging can be carried out using conventional equipment such as radiation sources that are well known in the art. As in most other imaging processes, the design and production of patterned tools and masks are required, also using processes that are well known in the art.

Still yet another advantage is that the polymer network forms in situ upon polymerization of the free radically polymerizable components. The polymer network can comprise a silicone (meth)acrylate copolymer that represents a broad class of materials. The silicone (meth)acrylate copolymers can be made by copolymerization of a family of telechelic free radically polymerizable siloxanes with various (meth)acrylate monomers. Optical films comprising the silicone (meth)acrylate copolymers can have a wide variety of properties depending on, for example, properties of the telechelic siloxane including its molecular weight and nature of functional end groups, as well as on the particular (meth)acrylate monomer and the ratio of the telechelic siloxane to (meth)acrylate monomer. Properties of the films disclosed herein can be varied depending on the desired application; for example, films ranging from strong elastomers to plastics can be made.

The method disclosed herein comprises applying an imageable composition to a substrate to form a layer of the imageable composition on the substrate, the imageable composition comprising a solution of free radically polymerizable monomers. In one embodiment, the imageable composition comprises a telechelic siloxane which is a siloxane having more than one free radically polymerizable end group. This chemistry is described in M. Mazurek; D. J. Kinning; T. Konoshita *J. Appl. Polym. Sci.* 2001, 80(2), 159; and U.S. Ser. Nos. 11/222,284 (Sherman et al.); 11/222,450 (Sherman et al.); 11/460,685 (Mazurek et al.); and 11/460,682 (Sherman et al.); the disclosures of which are incorporated herein by reference.

The polymer network formed by polymerization of the monomers comprises different phases, for example, the first and second phases described above. For a polymer network formed from a telechelic siloxane and (meth)acrylate monomer, the relatively non-polar siloxane may form one phase, and the polyacrylate may form the other phase. In general, the first and second phases have different refractive indices, i.e., refractive indices that differ by at least about 0.01. The difference between refractive indices of the first and second phases can be varied depending on the desired application in which the optical element is used. For example, in some cases, it may be desirable for the refractive indices of the phases in the polymer network to differ by at least about 0.05 and up to about 0.2. Typical refractive indices for polyorganosiloxane materials can be from about 1.40 to about 1.77, and for (meth)acrylate monomers can range between about 1.34 and 1.63.

Useful telechelic siloxanes comprise derivatives of bisamino-terminated polyorganosiloxanes, for example, acrylamidoamido siloxane (ACMAS), methacrylamidoamido siloxane (MACMAS), (meth)acryloxyurea siloxane (MAUS), and methylstyrylurea siloxane (MeStUS), as described in Mazurek et al. In general, these telechelic siloxanes are formed by reacting siloxane diamines with capping reagents such as vinyldimethylazlactone, isopropenyl dimethyl azlactone, isocyanatoethylmethacrylate, and m-isopropenyl α,α-dimethyl benzyl isocyanate, respectively. Collectively, ACMAS, MACMAS, MAUS, and MeStS can be represented by the formula:

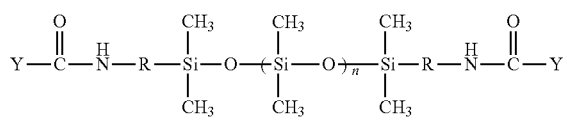

wherein

R is a divalent hydrocarbon group;

n is an integer from about 15 to about 1000; and

Y is selected from the group consisting of:

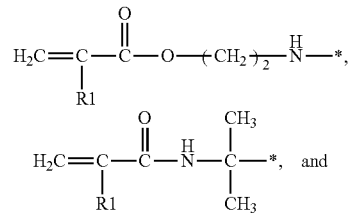

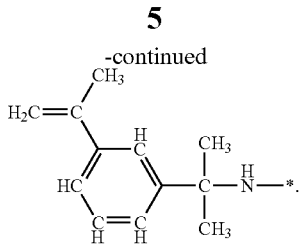

These telechelic siloxanes may have number average molecular weights in the range of from about 1,000 to about 200,000. U.S. Pat. No. 7,998,587 (Mazurek et al.) describes the preparation of these telechelic siloxanes.

Other siloxane diamines are described, for example, in U.S. Pat. No. 4,890,269 (Martin), U.S. Pat. No. 4,661,577 (Jo Lane et al.), U.S. Pat. No. 5,026,890 (Webb et al.), U.S. Pat. No. 5,276,122 (Aoki et al.), U.S. Pat. No. 5,214,119 (Leir et al.), U.S. Pat. No. 5,461,134 (Leir et al.), U.S. Pat. No. 5,512,650 (Leir et al.), and U.S. Pat. No. 6,355,759 (Sherman et al.), incorporated herein by reference. Some siloxane diamines are commercially available, for example, from Shin Etsu Silicones of America, Inc., Gelest Inc., and Wacker Chemie AG.

Other siloxane diamines include those represented by the formula:

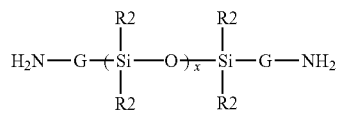

wherein $R^2$ is independently an alkyl, haloalkyl, aralkyl, alkenyl, aryl, or aryl substituted with an alkyl, alkoxy, or halo; G is independently an alkylene, aralkylene, or a combination thereof; and x is equal to an integer of about 15 to about 1000. These siloxane diamines can be prepared as described in U.S. Pat. No. 6,355,759 B1 (Sherman et al.) and U.S. Pat. No. 6,531,620 B2 (Brader et al.). Examples of polydiorganosiloxane diamines include polydimethylsiloxane diamine, polydiphenylsiloxane diamine, polytrifluoropropylmethyl-siloxane diamine, polyphenylmethylsiloxane diamine, polydiethylsiloxane diamine, polydivinylsiloxane diamine, polyvinylmethylsiloxane diamine, poly(5-hexenyl)methyl-siloxane diamine, and mixtures thereof.

The telechelic siloxanes are free radically polymerized with (meth)acrylate monomers. In general, useful monomers include those which, when homopolymerized, form a homopolymer having a glass transition temperature, a melting temperature, or both greater than about 40° C. Examples include (meth)acrylate acids such as (meth)acrylic acid, and esters of non-tertiary alkyl alcohols, the alkyl groups of which comprise from about 1 to about 20, or about 1 to about 18 carbon atoms. In one embodiment, (meth)acrylate monomers include benzyl methacrylate, cyclohexyl acrylate, cyclohexyl methacrylate, ethyl methacrylate, isobornyl acrylate, isobornyl methacrylate, methyl methacrylate, 1-methylcyclohexyl methacrylate, 2-methylcyclohexyl methacrylate, 3-methylcyclohexyl methacrylate, 4-methylcyclohexyl methacrylate, and 2-phenoxy ethyl methacrylate. In another embodiment, the silicone-(meth)acrylate copolymer comprising one or more (meth)acrylate monomers selected from the group consisting of iso-bornyl acrylate, tert-butyl acrylate, iso-octyl acrylate, cyclohexyl acrylate, trimethyl cyclohexyl acrylate, methyl methacrylate, and methacrylic acid. These monomers are suitable in forming a copolymer network with a free radically polymerizable siloxane. A single (meth)acrylate monomer or a combination of (meth)acrylate monomers may be used.

The relative amounts of telechelic siloxane and (meth) acrylate monomer is selected so that the desired morphology is obtained as described below. In one embodiment, the silicone-(meth)acrylate copolymer comprises from about 10/90 to about 75/25 (w/w) of one or more telechelic siloxanes to one or more (meth)acrylate monomers. In another embodiment, the silicone-(meth)acrylate copolymer comprises from about 25/75 to about 50/50 (w/w) of one or more telechelic siloxanes to one or more (meth)acrylate monomers.

The imageable composition can also comprise a photoinitiator. Suitable photoinitiators include benzoin ethers, benzophenone and derivatives thereof, acetophenone derivatives, camphorquinone, and the like. Some examples of commercially available photoinititaors include DARACUR 1173, DAROCUR 4265, IRGACURE 651, IRGACURE 1800, IRGACURE 369, IRGACURE 1700, and IRGACURE 907, commercially from Ciba Geigy. The photoinitiator may be used at a concentration of from about 0.1 to about 5 wt. % of the total polymerizable composition, and, if curing is carried out under an inerting fluid, the fluid is preferably saturated with the photoinitiator or photoinitiators being utilized in order to avoid the leaching of initiator from the reaction. The rapid cure observed for these materials allows for the use of relatively low levels of photoinitiator, hence uniform cure of thick sections can be achieved due to deeper penetration of radiation.

The substrate may comprise any of a variety of materials including polyesters such as polyethylene terephthalate (PET), polyethylene naphthalate, copolyesters or polyester blends based on naphthalene dicarboxylic acids; polycarbonates; polystyrenes; styrene-acrylonitriles; cellulose acetates; polyether sulfones; poly(meth)acrylates such as polymethylmethacrylate; polyurethanes; polyvinyl chloride; polycycloolefins; polyimides; glass; paper; or combinations or blends thereof. Properties to consider when selecting a suitable substrate and thickness include mechanical properties such as flexibility, dimensional stability, self-supportablity, chemical stability, etc.

The substrate is selected to be sufficiently transparent to the radiation used to expose the layer comprising the imageable composition. The degree of transparency or transmissivity of the substrate that is necessary depends on a variety of factors such as, for example, the particular components used in the imageable composition and the desired morphology of the layer after it is polymerized as this may be dependent on the rate at which polymerization occurs. Useful substrates are optically clear and designed to control the flow of light and may have a transmission of greater than about 90%.

Microstructured substrates may also be used. These substrates generally comprise a plurality of features wherein at least 2 dimensions of the features are microscopic. The topical and/or cross-sectional views of the features, therefore, are microscopic. As used herein, microscopic refers to dimensions small enough so as to require an optic aid to the naked eye when viewed from any plane of view to determine its shape. One criterion is found in Modern Optic Engineering by W. J. Smith, McGraw-Hill, 1966, pages 104-105 whereby visual acuity is defined and measured in terms of the angular size of the smallest character that can be recognized. Normal visual acuity is considered to be when the smallest recognizable letter subtends an angular height of 5 minutes of arc on the retina. At a typical working distance of 250 mm (10 inches), this yields a lateral dimension of 0.36 mm (0.0145 inch) for this object.

The microstructures may be formed along portions or all of any number of surfaces of the substrate. For example, some surfaces may include sections that have microstructures and sections that are free from microstructures. Alternatively, substantially all of a surface may include microstructures. In addition, the shape and/or configuration of the microstructures can also vary. For example, microstructures can include one or more projections, one or more depressions, a combination of projections and depressions, ridges, posts, pyramids, hemispheres, cones, protrusion, or any other suitable feature. The shapes of the various projections and/or depressions can also vary. For example, some embodiments of projections and/or depressions can be rounded in shape (e.g., circular, semicircular, spherical, hemispherical, oval, pill-shaped, partially pill-shaped, etc.) or include a rounded portion, polygonal in shape or include a polygonal portion (e.g., triangular, squared, cubed including cube corners, tetrahedrical, rectangular, paralleopiped, pentagonal, hexagonal, etc.), an irregular shape, a regular shape, a pointed shape, a truncated shape, combinations thereof, or any other suitable shape. In at least some of these as well as in other embodiments, the projections and/or depressions may include or define one or more channels, valleys, wells, ridges, and the like, combinations thereof, or any other configuration.

The imageable composition is coated onto the substrate; any of a variety of techniques may be used; for example, dip, roll, die, knife, air knife, slot, slide, wire wound rod, and curtain coating. A comprehensive discussion of coating techniques can be found in Cohen, E. and Gutoff, E. Modern Coating and Drying Technology; VCH Publishers: New York, 1992; p. 122; and in Tricot, Y-M. Surfactants: Static and Dynamic Surface Tension. In *Liquid Film Coating*; Kistler, S. F. and Schweizer, P. M., Eds.; Chapman & Hall: London, 1997; p. 99.

The layer of the imageable composition is exposed to actinic radiation so that the components are free radically polymerized. Typically, UV-visible radiation is used, but e-beam radiation may also be used. Further details concerning free radical curing techniques may be found in, for example, U.S. Pat. No. 4,654,233; U.S. Pat. No. 4,855,184; and U.S. Pat. No. 6,224,949. In one embodiment, as described below, the layer comprising the imageable composition can be cured and subsequently imaged or patterned using heat. In another embodiment, curing can be carried out in an imagewise manner to form exposed and unexposed areas. Imagewise exposure can comprise exposing the layer through a mask corresponding to the desired image, or by selective exposure of the layer using laser or other light source capable of responding to digital data signals corresponding to the desired image.

In some embodiments, as described below, the cured layer can be then be unaxially or biaxially oriented to form an anisotropic optical layer. By controlling the temperature, rate of stretch, amount of stretch, and other parameters of the orientation process, different features can be imparted. For example, in some cases, orientation of the optical layer and thus the polymer network results in form birefringence and can be achieved in a system by an anisotropic spatial arrangement of its optically isotropic components. As a result of orientation, the optical layer comprising the polymer network may exhibit polarization effects and/or directional scattering in which light is scattered in a preferred direction. Directional scattering by the polymer network is thought to occur from gross alignment of morphological structure such that scattering becomes compounded in a particular direction. By controlling the orientation process, these optical properties can be fine tuned as disclosed in Mazurek et al.

The layer of the imageable composition may be imaged by a heat patterning method. In this method, the layer is polymerized and then uniaxially or biaxially oriented. Heat is then applied in an imagewise manner to create the image. For example, a film of 25/75 50K ACMAS/IBA was prepared via free radical copolymerization of ACMAS with isobornyl acrylate (IBA). A solution of the components was prepared and photoinitiator (DAROCUR 1173) was added at 0.5 wt. %. The solution was cast between two transparent films of polyethylene terephthalate. The solution was then polymerized by exposure to low intensity UV light for 5 to 15 minutes. The resulting film, after removal of the two PET films, had a thickness of about 100 um and was hazy/white.

The film was uniaxially stretched by hand at room temperature which caused the sample to whiten presumably due to microcavitation. The whitened parts of the sample blocked red laser light by diffusion. Microcavitation was fully reversible once the stress force was relieved. The ends of a stretched coupon were fixed to a glass plate with tape. Using a simple tool comprising an assembly of the glass plates heated above 120 C, a sample pattern of a few parallel lines was pressed into the sample, parallel to the stretch direction, followed by a few parallel lines pressed in the cross direction. FIG. 1 shows a micrograph of the resulting imaged film with clearer and white (non-transparent) blocks, which appear as white stripes and dark blocks, respectively. The sample does not return to its original shape upon removal from the glass plate in that the sample was fixed by formation of the sealed clear stripes.

In another example of the heat patterning method, a strip of 50/50 50K MAUS/IBA was prepared as described in Mazurek et al. A strip was uniaxially stretched by hand at room temperature which caused the originally light blue sample of flexible plastic to become white with a bluish tint presumably due to crazing. Directional diffusion was observed for laser light passing through the sample. The stretched sample was then heat patterned as described in the previous paragraph to form a film with almost clear stripes and white blocks. The sample does not return to its original shape upon removal from the glass plate in that the sample was fixed by formation of the sealed clear stripes.

Patterning can also be carried out during cure. Polymerizable compositions of telechelic siloxanes and (meth)acrylate monomers were prepared as shown in Table 1. Photoinitiator (DAROCUR 1173) was added at 0.5 wt. %. For each example, about 100 um layer of the solution was placed on PET film and covered with another PET film. A mask was placed on top of the construction and covered with a glass sheet. The solution was exposed through the mask to low intensity UV lights for 15 minutes. Some of the more densely patterned areas wouldn't cure after typical 10 minute exposure. The mask was then removed and polymerization in the originally shaded areas was completed by exposure of the sample from both sides to UV lights for an additional 10 minutes. Two masks were used:

A. 8-pattern mask: 4 arrays of grids and 4 arrays of dots
B. 3 line arrays (2 clear/1 black; 1 clear/1 black; 1 clear/2 black)

Additionally, some fine print (marked in Table 1 as "B+fine") on the linear pattern mask was used to estimate crudely the limits of pattern resolution.

Figure 2A:
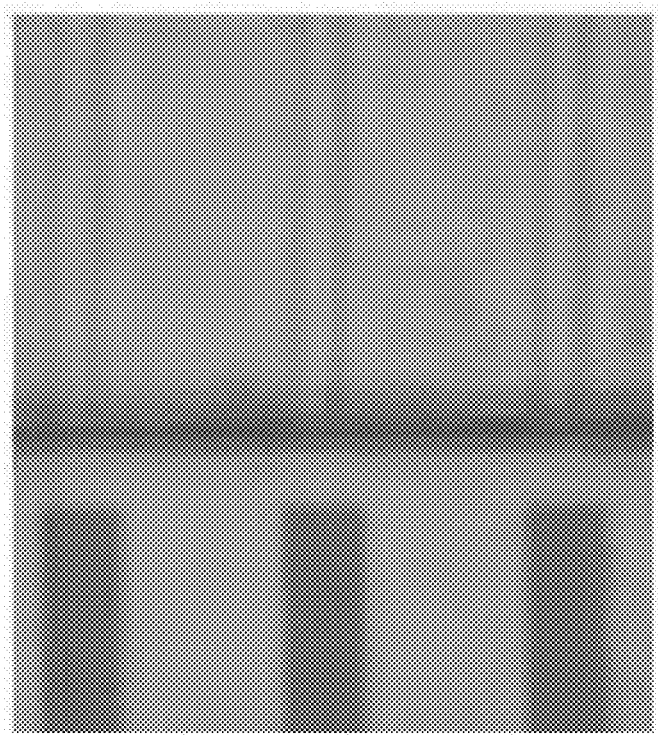
Figure 3:
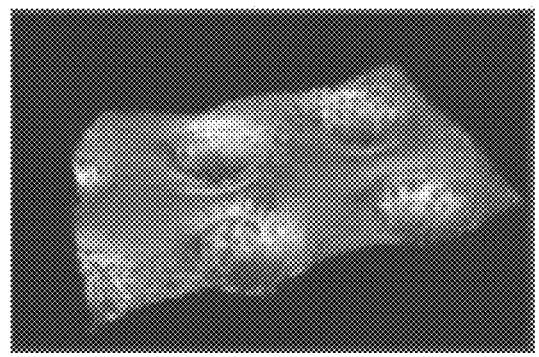
FIG. 3 shows ZYGO output data generated from an image formed according to the method disclosed herein.

FIGS. 2a-2c show images of Example 27; the masks with linear patterns are matched with the corresponding patterns created upon cure on the samples. FIG. 2a shows 2 clear/1 black; FIG. 2b shows 1 clear/1 black; and FIG. 2c shows 1 clear/2 black). FIG. 3 shows output from a ZYGO instrument: a three dimensional map of Example 29 after curing through the mask.

It has been discovered that by selective masking of the samples during the UV curing one can "write" visible patterns into the films. The patterns are due to the differences in the composition (mass movement) between the areas exposed to the light, and the ones originally shaded. At the same time, surface topology is imparted to the thus formed films due to the preferential regional shrinkage of the curing medium. This patterning approach revealed a wealth of opportunities associated with the controlled modification of optical properties of the silicone-acrylate copolymer films. It is believed that similar phenomena would be observed in other two-phase copolymer networks made by free-radical polymerization (no polymerization occurs in the shaded areas). The state-of the-art in this field has not been recognized at this point, although "photo-printing" (or photoimaging) of curable systems is known.

TABLE 1

| Ex. | Silicone | Ratio with IBA (w/w) | Mask | Features | Other Characteristics |
|---|---|---|---|---|---|
| 1 | 50K ACMAS | 25/75 | A<br>B | White; whiter in shaded areas | Selective cavitation when stretched |
| 2 | 50K ACMAS | 40/60 | | Bluish/white; shaded: hazy white | |
| 3 | 50K ACMAS | 50/50 | A<br>B | Bluish; shaded: bluish/white<br>Blue; bluish/white in shaded areas | 1 mm thick: blurred image; Surface topology visible Selective cavitation |
| 4 | 50K ACMAS | 60/40 | | Light blue; shaded: blue | |
| 5 | 33K ACMAS | 25/75 | A | White; whiter | |
| 6 | 33K ACMAS | 35/65 | A<br>B | White; whiter in shaded areas | |
| 7 | 33K ACMAS | 40/60 | A | Whitish/blue; whitish distinct pattern | |
| 8 | 33K ACMAS | 50/50 | A | Hazy/blue; whitish (distinct pattern) | |
| 9 | 33K ACMAS | 60/40 | A | Almost clear; Shaded: light blue | |
| 10 | 20K ACMAS | 25/75 | A | Hazy; whitish patterns | |
| 11 | 20K ACMAS | 50/50 | B | Very light blue; hazy blue patterns | |
| 12 | 14K ACMAS | 50/50 | A | Almost clear; hazy blue patterns | |
| 13 | 5K ACMAS | 40/60 | A<br>B | Light blue/hazy; clear dots in both patterns;<br>Hazy; clearer in shaded areas | |
| 14 | 5K ACMAS | 50/50 | A<br>B | Light blue; clear in shaded areas; hazy center points<br>Clearer in shaded areas | |
| 15 | 5K ACMAS | 60/40 | A<br>B | Bluish; clear dots in both patterns<br>Bluish; clearer in shaded areas | |
| 16 | 50K MAUS | 25/75 | A | Blue; white/blue in shaded areas | Plastic; crazes white - images written with heat |
| 17 | 50K MAUS | 40/60 | B<br>B × B Top + Bottom | Clear; clear<br>Clear; clear: patterns visible; less diffraction | Soft plastic; crazes white upon stretching<br>Soft plastic; whitens upon stretching; recovers |
| 18 | 50K MAUS | 50/50 | A | Almost clear; bluish in shaded areas | Soft plastic |
| 19 | 20K MAUS | 25/75 | A | Clear; clear - well visible topology | |
| 20 | 20K MAUS | 50/50 | B + fine | Clear; clear - well visible patterns | |
| 21 | 50K MeStUS | 25/75 | A | Very lightly bluish - well visible patterns | Flexible plastic; crazes when bent or stretched; orientated becomes strong, clear plastic; shows directional scattering |
| 22 | 50K MeStUS | 50/50 | A | Clear; clear, well visible patterns | Flexible plastic |

TABLE 1-continued

| Ex. | Silicone | Ratio with IBA (w/w) | Mask | Features | Other Characteristics |
|-----|----------|----------------------|------|----------|----------------------|
| 23 | 50K MeStUS | 60/40 | A | Clear; clear, well visible patterns | Flexible plastic |
| 24 | 33K MeStUS | 40/60 | A | Clear; clear, well visible patterns | Crazes selectively |
| 25 | 33K MeStUS | 50/50 | | Clear; clear, well visible patterns | |
| 26 | 20K MeStUS | 25/75 | B 2 layer | Clear; clear, well visible pattern Crazing where double-coated; x-pattern | Crazes easily |
| 27 | 20K MeStUS | 50/50 | B 2 layer | Clear; well visible pattern Good x-pattern | Soft plastic |
| | | | B × B Top + bottom | Good x-pattern; less pronounced diffraction in laser light | |
| 28 | 14K MeStUS | 50/50 | B | Clear; clear - well visible patterns | Soft plastic |
| 29 | 90K ACMAS/IOA[1] | 50/50 | A | See FIG. 3 | |
| 30 | 50K ACMAS/IOA[1] | 50/50 | | Light blue; shaded: bluish | |

[1] isooctyl acrylate (IOA) was used instead of IBA

The film of Example 27 was used to demonstrate multiple step patterning. After the film was imaged using Mask A, the top PET liner was removed from the film, and a new 100 um layer of the same composition was coated and then covered with PET. This layer was then cured through Mask A positioned 90 degrees with respect to the first pattern. Both patterns were observed. In a separate experiment, the same composition was simultaneously cured from top and bottom through two masks oriented 90 degrees with respect to each other and positioned on both sides of the film. Both patterns were clearly visible, similar to that observed for patterning in two separate steps. Laser light scattering on the two samples was then carried out and showed differences. Presumably, differences were due to areas in the single step patterning method which were partially exposed to the UV lights throughout the curing process as compared to the two step method in which areas at the intersections of the lines were shadowed before the masks were removed to complete the cure.

Figure 4:
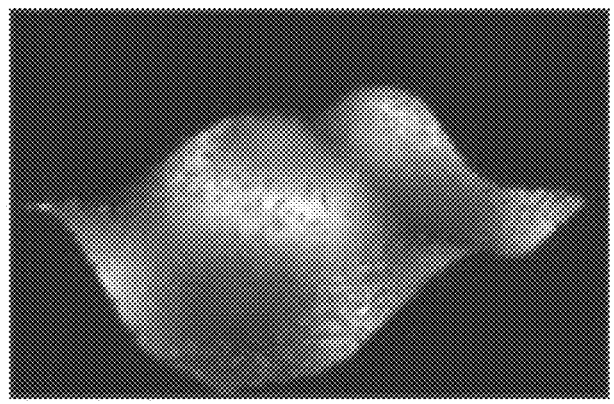
FIG. 4 shows ZYGO output data generated from a PET cover film formed by forming an image according to the method disclosed herein.

Patterning during cure can be used as a microstructuring method. As exemplified above, patterning creates surface topology of the films. Presumably, this is due to regional shrinkage. In some cases, the topology was visible and could be felt on the surface of the PET cover film. FIG. 4 shows the three dimensional image of the PET cover film from Example 22 after curing. The surface of this PET film could be further replicated, e.g., by electroforming, and made into a durable microreplication tool.

The composition used in Example 8 was cured against a cube-cornered Diamond Grade metal tool using Mask A. A distinct retroreflective pattern was created. A hazy-bluish sample showed hazy-white areas which appeared brown in a retro-viewer.

Patterning could also be imposed by using simple masks having different scales of grayness. A mask with the 3M logo was made by printing three images at different levels of grayness. The mask was used to create 3M retro-reflective logos against the retro-reflective background. The composition from Example 12 showed a retro-reflective 3M logo somewhat more bluish than the background; the composition from Example 15 showed a logo somewhat clearer than the background.

Figure 5:
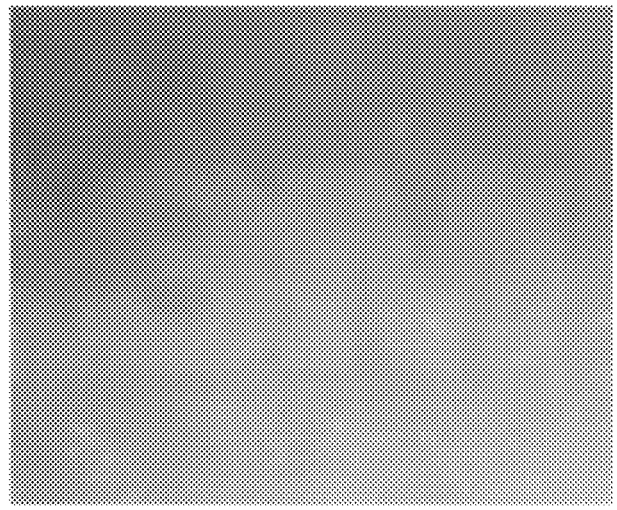
FIG. 5 shows an image formed on retroreflective media according to the method disclosed herein.

Another crude mask with large 3M logo characters was patterned with perpendicular single-space single black lines using PAINT Microsoft program. The mask was made by printing a pattern on the laser printer. The composition from Example 9 was cured against the cube-corner tool through such a mask. A rather uniform, strongly reduced retro-reflectivity of the logo was observed on the elastomeric film (easily wets substrates; fairly robust cubes) which is shown in FIG. 5. In another experiment, the composition from Example 12 was cured against a full-cube metal tool through the mask with 3M logo. The 3M logo was visible in a retro-viewer.

Figure 6A:
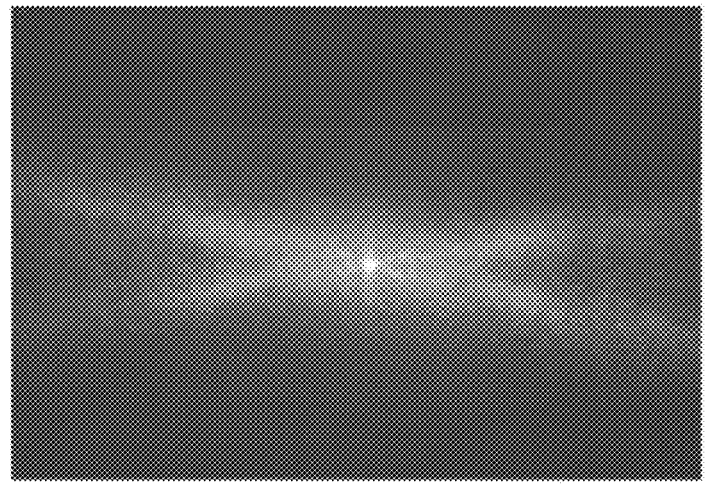
FIG. 6a shows a polarized light micrograph formed by an oriented film comprising liquid crystal additive.
Figure 6B:
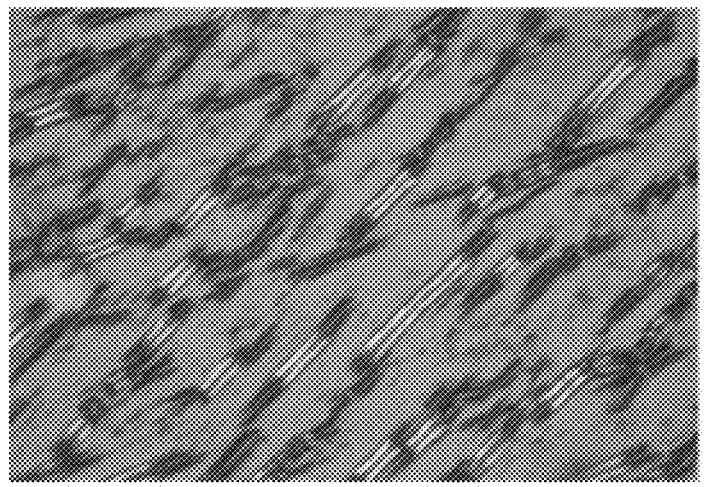

BL036 nematic liquid crystals (Merck) at 2% were added to a composition of 40/60 90K ACMAS/IBA with photoinitiator and cured. The sample was somewhat hazier compared to a cured sample of the composition without the liquid crystals. The sample with the liquid crystals was stretched 400-500% while heated, and quenched. The sample showed a very distinct diffractive pattern in laser light as shown in FIG. 6a. A micrograph of the film is shown in FIG. 6b. An especially strong pattern was visible when the sample (still elastomeric at this elongation) was tested in its relaxed form. When slightly stretched, it shows less of the diffraction pattern and more of the directional (cross-direction) diffusion. A similar effect was observed in the sample made of 50/50 90K ACMAS/IBA composition containing 2% BL036 nematic LC. Similar effects were observed in the compositions made of 50K ACMAS/IBA containing 2% BL036 nematic LC.

50/50 50K ACMAS/IOA and 5% BL036 nematic LC was cured to check the feasibility of the room temperature orientation of domains carrying soluble additives. While stretched the sample scatters light directionally.

BL036 at 2.5% was incorporated into the 50/50 33K MeStUS/IBA composition and cured through the 8-pattern mask. All the patterns were well imaged clear on the clear film. No visible difference was observed-between this sample and the sample without the liquid crystals. However, after a few weeks the sample became hazy upon room temperature stretching showing some diffractive patterns. When a new sample of the same composition was cured no visible haze was detected upon stretching. Diffractive patterns were visible on the unstretched sample when PET covers were removed.

The invention may be more completely understood in consideration of the foregoing examples, but they are not intended to limit the scope of the invention in any way.

What is claimed is:

1. A method of forming an image, comprising:
providing a substrate;
applying an imageable composition to the substrate to form a layer of the imageable composition on the substrate, the imageable composition comprising telechelic siloxane and (meth)acrylate monomers;
imagewise exposing the layer to radiation to form exposed and unexposed areas, the exposed areas comprising a first polymer network exhibiting a first phase and a second phase that are chemically connected and have different refractive indices, the first phase being continuous, and the second phase comprising a plurality of structures dispersed within the first phase; and
exposing the unexposed areas to radiation to form a second polymer network comprising a third phase and a fourth phase that are chemically connected and have different refractive indices, the third phase being continuous, and the fourth phase comprising a plurality of structures dispersed within the third phase; wherein the first and second polymer networks are chemically connected, and morphology formed by the first and second phases is different than that formed by the third and fourth phases.

2. The method of claim 1, the telechelic siloxane comprising bis(3-aminopropyl)polydimethylsiloxane derivative or a compound represented by the formula:

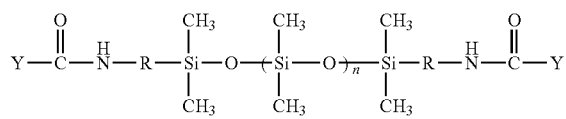

wherein
R is a divalent hydrocarbon group;
n is an integer from about 15 to about 1000; and
Y is selected from the group consisting of:

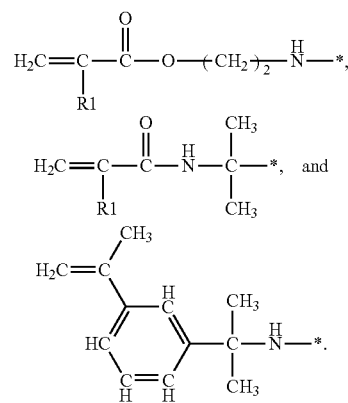

3. The method of claim 1, wherein the telechelic siloxane is derived from a siloxane diamine represented by the formula:

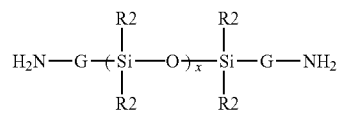

wherein
$R^2$ is independently an alkyl, haloalkyl, aralkyl, alkenyl, aryl, or aryl substituted with an alkyl, alkoxy, or halo;
G is independently an alkylene, aralkylene, or a combination thereof; and
x is equal to an integer of from about 15 to about 1000.

4. The method of claim 1, the (meth)acrylate monomer selected from the group consisting of iso-bornyl acrylate, iso-bornyl methacrylate, tert-butyl acrylate, iso-octyl acrylate, cyclohexyl acrylate, cyclohexyl methacrylate, trimethyl cyclohexyl acrylate, methyl methacrylate, methacrylic acid, benzyl methacrylate, ethyl methacrylate, 1-methylcyclohexyl methacrylate, 2-methylcyclohexyl methacrylate, 3-methylcyclohexyl methacrylate, 4-methylcyclohexyl methacrylate, 2-phenoxy ethyl methacrylate, 2-ethylhexyl acrylate, and hexanediol dimethacrylate.

5. The method of claim 1, wherein the ratio of monomers comprises from about 25/75 to about 50/50 (w/w) of telechelic siloxane to (meth)acrylate monomer.

6. The method of claim 1, wherein imagewise exposing comprises applying UV-visible radiation or e-beam radiation.

7. The method of claim 1, wherein imagewise exposing the layer to radiation comprises exposing the layer to the radiation using a mask.

8. The method of claim 1, wherein imagewise exposing the layer to radiation comprises using a laser.

9. The method of claim 1, wherein the imageable composition is applied on an outer surface of the substrate, and the outer surface comprises a plurality of features.

10. The method of claim 9, wherein at least two dimensions of the features are microscopic.

11. The method of claim 1, wherein the imageable composition comprises liquid crystals, nanoparticles, or a mixture thereof.

12. The method of claim 1, wherein the imageable composition further comprises a photoinitiator.

13. The method of claim 1, further comprising:
uniaxially orienting the first and second polymer networks to form an anisotropic optical film.

14. The method of claim 1, further comprising:
biaxially orienting the first and second polymer networks to form an anisotropic optical film.

15. An image formed according to the method of claim 1.

* * * * *

UNITED STATES PATENT AND TRADEMARK OFFICE
CERTIFICATE OF CORRECTION

PATENT NO.           : 8,637,226 B2                        Page 1 of 1
APPLICATION NO.      : 13/368401
DATED                : January 28, 2014
INVENTOR(S)          : Mieczyslaw Mazurek et al.

It is certified that error appears in the above-identified patent and that said Letters Patent is hereby corrected as shown below:

In the Specification

Column 6
Line 17, Delete "photoinititaors" insert -- photoinitiators --, therefor.
Line 17, Delete "DARACUR 1173," insert -- DAROCUR 1173, --, therefor.
Line 40, Delete "self-supportablity," insert -- self-supportability, --, therefor.

Column 7
Line 18, Delete "paralleopiped," insert -- parallelepiped, --, therefor.
Line 52, Delete "unaxially" insert -- uniaxially --, therefor.

Signed and Sealed this
Third Day of March, 2015

Michelle K. Lee
*Deputy Director of the United States Patent and Trademark Office*